(12) United States Patent
Lim et al.

(10) Patent No.: US 9,068,110 B2
(45) Date of Patent: Jun. 30, 2015

(54) POLISHING SLURRY AND CHEMICAL MECHANICAL PLANARIZATION METHOD USING THE SAME

(71) Applicants: SK hynix Inc., Icheon-si (KR); Korea University Research and Business Foundation, Seoul (KR)

(72) Inventors: Dae Soon Lim, Seoul (KR); Dong Hee Shin, Goyang-si (KR); Dong Hyeon Lee, Seoul (KR); Il Ho Yang, Icheon-si (KR); Yang Bok Lee, Seoul (KR)

(73) Assignees: SK HYNIX INC., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 13/736,834

(22) Filed: Jan. 8, 2013

(65) Prior Publication Data

US 2013/0178064 A1 Jul. 11, 2013

(30) Foreign Application Priority Data

Jan. 9, 2012 (KR) ........................ 10-2012-0002668

(51) Int. Cl.
*H01L 21/302* (2006.01)
*H01L 21/461* (2006.01)
*C09K 13/00* (2006.01)
*H01L 21/306* (2006.01)
*C09K 3/14* (2006.01)
*C09G 1/02* (2006.01)
*H01L 21/321* (2006.01)

(52) U.S. Cl.
CPC .......... *C09K 13/00* (2013.01); *H01L 21/30625* (2013.01); *C09K 3/1463* (2013.01); *C09G 1/02* (2013.01); *H01L 21/3212* (2013.01)

(58) Field of Classification Search
USPC ............................... 216/88–91; 438/690–692
See application file for complete search history.

(56) References Cited

U.S. PATENT DOCUMENTS

| | | | | |
|---|---|---|---|---|
| 5,264,010 A | * | 11/1993 | Brancaleoni et al. | ........... 51/308 |
| 2004/0120915 A1 | | 6/2004 | Yang et al. | |
| 2005/0239985 A1 | * | 10/2005 | Lichtenhan et al. | ........... 528/15 |
| 2007/0178700 A1 | * | 8/2007 | Dysard et al. | ................. 438/689 |
| 2010/0015807 A1 | * | 1/2010 | Kim et al. | ..................... 438/693 |
| 2011/0105000 A1 | | 5/2011 | Hu et al. | |

* cited by examiner

*Primary Examiner* — Allan Olsen
*Assistant Examiner* — Margaret D Klunk

(57) ABSTRACT

A polishing slurry for a chemical mechanical planarization process includes polishing particles and polyhedral nanoscale particles having a smaller size than the polishing particles and including a bond of silicon (Si) and oxygen (O).

19 Claims, 10 Drawing Sheets

POLISHING SLURRY AND CHEMICAL MECHANICAL PLANARIZATION METHOD USING THE SAME

CROSS-REFERENCE TO RELATED APPLICATION

The present application claims priority under 35 U.S.C. 119(a) to Korean application number 10-2012-0002668, filed on Jan. 9, 2012, in the Korean Patent Office, which is incorporated by reference in its entirety.

BACKGROUND

1. Technical Field

The present invention relates to semiconductor technology, and more particularly, to a polishing material for chemical mechanical planarization of a thin film and a chemical mechanical planarization method using the same.

2. Related Art

In recent years, with increase in demand for portable digital devices such as digital cameras, MP3 players, personal digital assistants (PDAs), and portable phones, the nonvolatile memory market is rapidly expanding. As flash memory devices, which are programmable nonvolatile memory devices, reach the limit of scaling, nonvolatile memory devices such as phase-change random access memory (PcRAM) devices or resistive random access memory (ReRAM) devices using a variable resistor with a reversibly changeable resistance value have received attention as an alternative to the flash memory devices. Since the nonvolatile memory devices use a physical property of the variable resistor itself as a data state, a configuration of a cell can be simplified so that miniaturization of the memory device can be realized.

A resistance value of chalcogenide materials, such as a germanium (Ge)-antimony (Sb)-tellurium (Te) alloy, may be changed according to a material phase or an intensity or width of an applied electrical signal. Thus, chalcogenides have been widely studied as candidate materials for the above-described non-volatile memory devices. In non-volatile memory devices, the chalcogenide material may be formed with a damascene process in which the chalcogenide material is buried in holes formed in an interlayer insulating layer. Chemical mechanical polishing (CMP) may be used as a planarization method in the damascene process.

A CMP process may be optimized for the material that is being removed. Existing processes are optimized for copper and aluminum. Since chalcogenide materials include metal compounds with two or more different elements, it may be helpful to develop a new process for chalcogenide materials. Further, when a chalcogenide material is formed in a damascene structure, since the chalcogenide material may be formed in a cell pitch of below 20 nm to enhance the integration density, a low surface profile and low defect level in a polishing surface have to be ensured. CMP characteristics that are desirable to be optimized include uniformity and polishing speed. CMP techniques for chalcogenide materials may also be applied to a metal oxide material containing two or more different kinds of metal or metalloid elements, for example, Perovskite-based metallic compound such as $PbZr_xTi_{1-x}O_3$.

SUMMARY

Embodiments of the present invention include a reliable, low cost polishing slurry for a CMP process on a thin film containing two or more metal or metalloid elements which may be used in the fabrication of nonvolatile memory devices.

Embodiments of the present invention include a method of a chemical mechanical planarization of a substrate having a surface on which a thin film with two or more metal or metalloid materials is formed.

According to an aspect of the present invention, there is a provided a polishing composition for planarization of a thin film containing two or more different kinds of metal or metalloid elements. The polishing composition may include polishing particles and nanoscale particles of polyhedral structure having a smaller size than the polishing particles and including a bond of silicon (Si) and oxygen (O).

The polishing particles may include alumina ($AlO_x$), ceria ($CeO_x$), zirconia ($ZrO_x$), titania ($TiO_x$), germania ($GeO_x$), chromium oxide ($CrO_x$), manganese oxide ($MnO_x$), silica ($SiO_x$) or a combination thereof. The polishing particles may have an average size of about 10 nm to about 150 nm. In some embodiments, the polishing particles may have an average size of about 10 nm to about 100 nm.

The nanoscale particles may include a polyhedral oligomeric silsesquioxane (POSS) compound. The POSS compound may include a compound having a formula $(RSiO_{1.5})_m(R'SiO_{1.5})_n(XSiO_{1.5})_l$. R and R' are organic substituents and X is a functional group. Each of m, n, and l is an integer greater than or equal to 0 (zero) and m+n+l≥6. In some embodiments, m+n+l≤12.

In some embodiments, the organic substituents may include hydrogen, acids, an alcohol-based functional group, a carboxyl-based functional group, an ester-based functional group, an ether-based functional group, an amine-based functional group, a thiol-based functional group, a ketone-based functional group, a phosphate-based functional group, an olefin-based functional group or a combination thereof. The functional group for the POSS compound may include a hydroxyl group, a halogen group, an alkoxide group, an acetate group, a peroxide group, an amine group, an isocyanate group, or a combination thereof.

In some embodiments, polymerization of the POSS compound may be limited in the polishing composition. The polishing composition may further include deionized water, an oxidizing agent, a surfactant, a pH regulator or a combination thereof.

The thin film may further include a chalcogenide material or a chalcogenide glass material. The thin film may further include tellurium (Te).

According to another aspect of an exemplary embodiment, there is a provided a method of chemical mechanical planarization of a substrate having a surface on which a thin film containing two or more different kinds of metal or metalloid elements is formed. The method may include: providing the substrate so that the surface of the substrate comes in contact with a polishing pad; providing a polishing composition between the polishing pad and the surface of the substrate, the polishing composition including polishing particles and nanoscale particles of polyhedral structure, the nanoscale particles having a smaller size than the polishing particles and including a bond of silicon (Si) and oxygen (O); and polishing the thin film with the polishing composition.

The polishing particles may include alumina ($AlO_x$), ceria ($CeO_x$), zirconia ($ZrO_x$), titania ($TiO_x$), germania ($GeO_x$), chromium oxide ($CrO_x$), manganese oxide ($MnO_x$), silica ($SiO_x$) or a combination thereof. The polishing particles may have an average size of about 10 nm to about 150 nm. In some embodiments, the polishing particles may have an average size of about 10 nm to about 100 nm.

The polyhedral structure of nanoscale particles may include a polyhedral oligomeric silsesquioxane (POSS) compound. The POSS compound may include a compound having a formula $(RSiO_{1.5})_m(R'SiO_{1.5})_n(XSiO_{1.5})_l$. R and R' are organic substituents and X is a functional group. Each of m, n, and l is an integer greater than or equal to 0 (zero) and m+n+l≥6. In some embodiments, m+n+l≤12.

In some embodiments, the organic substituents may include hydrogen, acids, an alcohol-based functional group, a carboxyl-based functional group, an ester-based functional group, an ether-based functional group, an amine-based functional group, a thiol-based functional group, a ketone-based functional group, a phosphate-based functional group, an olefin-based functional group or a combination thereof. The functional group for the POSS compound may include a hydroxyl group, a halogen group, an alkoxide group, an acetate group, a peroxide group, an amine group, an isocyanate group, or a combination thereof.

In some embodiments, the POSS compound is adjusted to limit polymerization of the POSS compound during the polishing. The polishing composition may further include deionized water, an oxidizing agent, a surfactant, a pH regulator or a combination thereof.

The thin film may further include a chalcogenide material or a chalcogenide glass material. The thin film may further include tellurium (Te).

These and other features, aspects, and embodiments are described below in the section entitled "DETAILED DESCRIPTION".

BRIEF DESCRIPTION OF THE DRAWINGS

Hereinafter, embodiments of the present invention will be described in greater detail with reference to the accompanying drawings.

FIG. 5A is a graph showing polishing speeds of Embodiments 1 to 5 and Comparative Example 1, while

DETAILED DESCRIPTION

Figure 1:
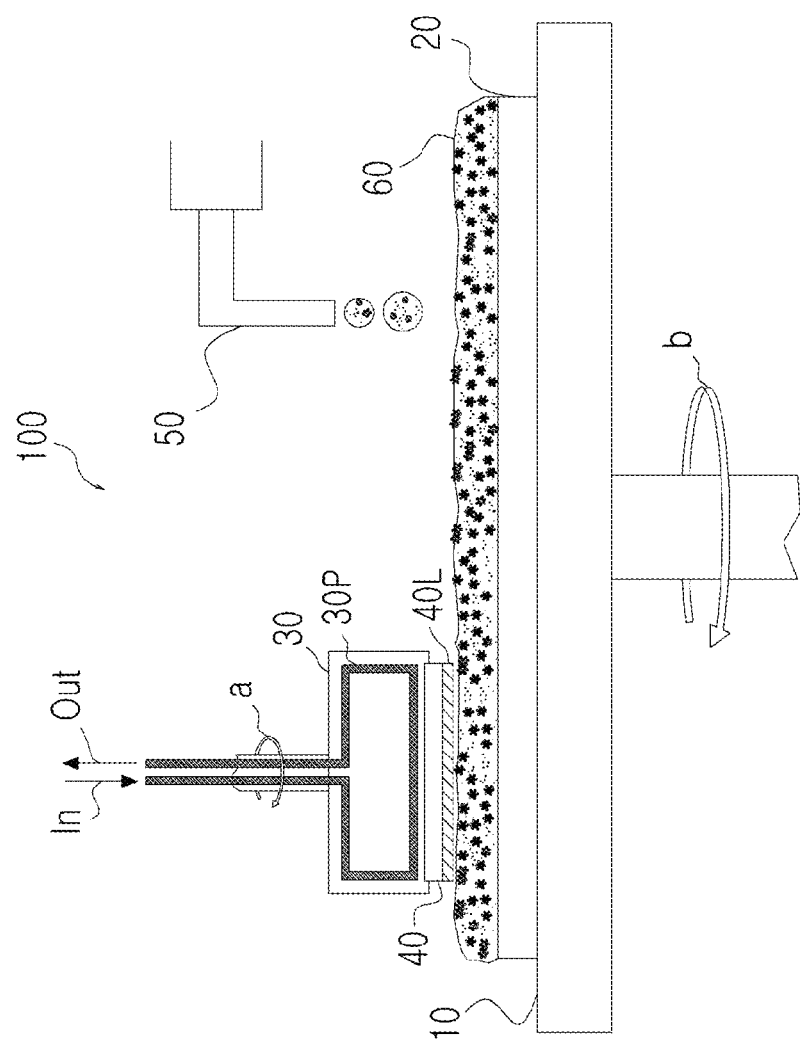
FIG. 1 is a view schematically illustrating chemical mechanical planarization of a substrate on which a thin film is formed using an apparatus according to an embodiment of the present invention.

Hereinafter, exemplary embodiments will be described in greater detail with reference to the accompanying drawings.

Embodiments of the present invention may be provided to describe the concept of the invention more completely to those skilled in the art. The present invention may, however, be embodied in many different forms and should not be construed as being limited to the embodiments set forth herein; rather, these embodiments are provided so that this disclosure will be thorough and complete, and will fully convey the concept of the invention to those skilled in the art.

Like reference numerals in the drawings denote like elements. The term "and/or" used herein includes any one of listed items or a combination of two or more thereof.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or group thereof, but do not preclude the presence or addition of one or more other features, integers, steps, operations, elements, components, and/or groups thereof.

It is also understood that when a layer is referred to as being "on" another layer or substrate, it can be directly on the other or substrate or intervening layers or layers formed in the intervening layers may also be present. It will be clearly understood by those skilled in the art that a structure or shape "adjacent to" another shape may have a portion overlapping the other shape or a portion below the other shape.

Spatially relative terms, such as "below", "above", "upper", "lower" "horizontal", or "vertical", may be used herein for ease of description to describe one element, layer, or region's relationship to another element(s), layer(s), or region(s) as illustrated in the figures. It will be understood that spatially relative terms are intended to encompass different orientations of the device in use or operation in addition to the orientation depicted in the figures.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity.

FIG. 1 is a view illustrating chemical mechanical planarization of a substrate 40 on which a thin film 40L is formed using a chemical mechanical planarization apparatus 100 according to an embodiment of the present invention.

Referring to FIG. 1, the chemical mechanical planarization apparatus 100 may include a platen 10, a polishing pad 20, and a polishing head 30. The polishing head 30 may further include a mechanism which supports the substrate 40 and applies a torque to the substrate 40.

The substrate 40 may be supported by the polishing head 30 so that the thin film 40L including two or more different kinds of metal or metalloid elements, which is a surface to be polished, is oriented toward the polishing pad 20 and the polishing head 30 may apply constant pressure to the substrate 40 with respect to the polishing pad 20. The pressure may be in a range of about 0.02 $kg/cm^2$ through about 0.1 $kg/cm^2$. A material of the polishing pad 20 may be appropriately selected in view of hardness and porosity thereof.

The substrate 40 and the polishing pad 20 may be mutually rotated as indicated by arrows "a" and "b." In some embodiments, the polishing pad 20 may be rotated at a velocity between about 30 revolutions per minute (RPM) and about 120 RPM. The substrate 40 may be rotated between about 70 RPM and about 120 RPM.

A polishing slurry 60 is supplied on the polishing pad 20 by a slurry dispenser 50. The polishing slurry 60 may be supplied until the polishing pad 20 is saturated with the polishing slurry 60. The polishing pad 20 may draw the polishing slurry 60 under the polishing head 30 which is rotating, and the thin film 40L on the substrate 40 may be chemically mechanically polished via the polishing slurry 60.

The chemical mechanical planarization apparatus 100 may further include a temperature control unit to control polishing characteristics of the thin film 40L. In some embodiments, the temperature control unit may include a cooling unit provided in the polishing head 30. The cooling unit may cool the substrate 40 so that a polishing process may be performed in a temperature range of about 10° C. through about 40° C., or preferably in a narrower temperature range of about 15° C. through about 30° C. For example, as shown in FIG. 1, the cooling unit may include a passage 30P inside the polishing head 30 and a cooling fluid circulating through the passage 30P. In other embodiments, a cooling unit such as the passage 30P and the cooling fluid may be also provided in the slurry dispenser 50 to control the temperature of the polishing slurry 60.

In the embodiment illustrated in FIG. 1, the chemical mechanical planarization apparatus 100 has only one polishing head 30. However, a plurality of polishing heads may be provided to be operated simultaneously on the polishing pad 20. In other embodiments, one polishing head 30 may support a plurality of substrates 40 to perform a chemical mechanical polishing (CMP) process on the plurality of substrates. In other embodiments, a chemical mechanical planarization apparatus 100 may have a configuration in which any one of the polishing pad 20 and the substrate 40 rotates and the other linearly moves, thereby operating with a combination of rotational and linear motion. For example, an embodiment of the chemical mechanical planarization apparatus 100 may have a configuration in which the polishing head supporting the substrate rotates and the substrate 40 linearly passes over the polishing head 30.

The polishing slurry 60 may include polishing particles and nanoscale particles of polyhedral structure. The polishing particles may have a concentration in a range of about 0.1 wt % through about 20 wt % of the polishing slurry of 100 wt %. The nanoscale particles may have a concentration in a range of about 0.1 wt % through about 3 wt % of the polishing slurry of 100 wt %.

Other components of the polishing slurry 60 may include deionized water for liquefying the polishing slurry 60, and an oxidizing agent. The oxidizing agent may include hydrogen peroxide or iron nitrate. However, embodiments of the present invention are not limited thereto. In some embodiments, a surfactant and a pH regulator may be further added in the polishing slurry 60 to improve stability of the polishing slurry 60. The surfactant may be an appropriate nonionic, anionic, cationic, or amphoteric surfactant which is commercially available. The pH regulator may include an appropriate acid or base to increase or reduce pH of the polishing slurry 60.

The polishing particles may include alumina ($AlO_x$), ceria ($CeO_x$), zirconia ($ZrO_x$), titania ($TiO_x$), germania ($GeO_x$), chromium oxide ($CrO_x$), manganese oxide ($MnO_x$), silica ($SiO_x$), or a combination thereof. The silica particles may be, for example, fumed silica. In various embodiments, polishing particles may have an average size of about 10 nm through about 150 nm. Preferably, the polishing particles may have an average size of about 10 nm through about 100 nm.

The nanoscale particles may include a compound of polyhedral structure having a smaller size than the polishing particles. The nanoscale particles of polyhedral structure may include a polyhedral oligomeric silsesquioxane (POSS) compound including a silicon (Si) atom bonded to an oxygen (O) atom.

The POSS compound may include a compound having a formula $(RSiO_{1.5})_m$, where m is an integer equal to or greater than 6 and R is an appropriate organic substituent. For example, in various embodiments the organic substituent may include hydrogen, acids, an alcohol-based functional group, a carboxyl-based functional group, an ester-based functional group, an ether-based functional group, an amine-based functional group, a thiol-based functional group, a ketone-based functional group, a phosphate-based functional group, an olefin-based functional group or a combination thereof. In an embodiment, the POSS compound may have a homoleptic structure. The organic substituent may chemically and/or electrically combine the polishing particles and the nanoscale particles, for example, silica particles and the POSS compound, and thus an intermediate particle structure for polishing, which is formed by surrounding surfaces of the polishing particles with the POSS compound, may be provided as described later with reference to FIG. 3.

In another embodiment, the POSS compound may include different kinds of organic substituents R and R'. In such an embodiment, the POSS compound has a heteroleptic structure, and the POSS compound may be represented by a formula $(RSiO_{1.5})_n(R'SiO_{1.5})_l$. The value of n+l may be an integer equal to or greater than 6. The organic substituents may include two or more different organic substituents such as the above-described organic substituents.

In further another embodiment, the POSS compound may include a functional group. In such an embodiment, the POSS compound may be expressed by a formula $(RSiO_{1.5})_m(XSiO_{1.5})_l$. The value of m+l may be an integer equal to or greater than 6. The functional group may include a hydroxyl group (—OH), a halogen group (for example, at least one of fluorine (F), chlorine (Cl), bromine (Br), and iodine (I)), an alkoxide group (—OR), an acetate group (OOCR), a peroxide group (OOR), an amine group ($NR_2$), an isocyanate group (NCO), or a combination thereof.

FIGS. 2A to 2D illustrate POSS compounds according to various embodiments of the present invention.

Figure 2A:
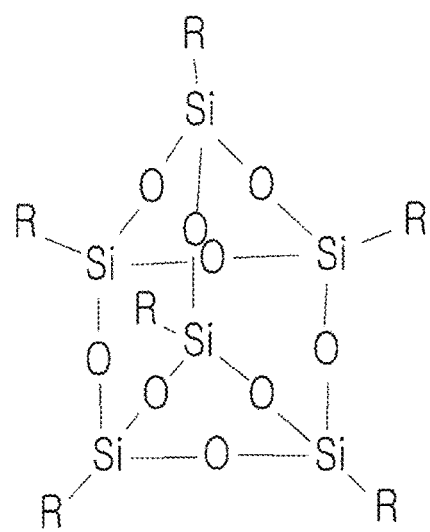
FIGS. 2A to 2D are views illustrating POSS compounds according to various embodiments of the present invention.

Referring to FIG. 2A, in an embodiment, the POSS compound may include a nanoscale particle structure having six silicon (Si) atoms and expressed by a formula $(RSiO_{1.5})_6$. R may be one of the above-described organic substituents. The organic substituents may be homogeneous as shown in FIG. 2A. In this case, the POSS compound may have a homoleptic structure.

Although not shown, as described above, an embodiment may include a POSS compound with more than one type of organic substituent. In such an embodiment, the POSS compound may have a heteroleptic structure. In other embodiments, one or more of the above-described functional groups may be bonded to the silicon atoms in the R locations instead of the organic substituents.

Figure 2B:
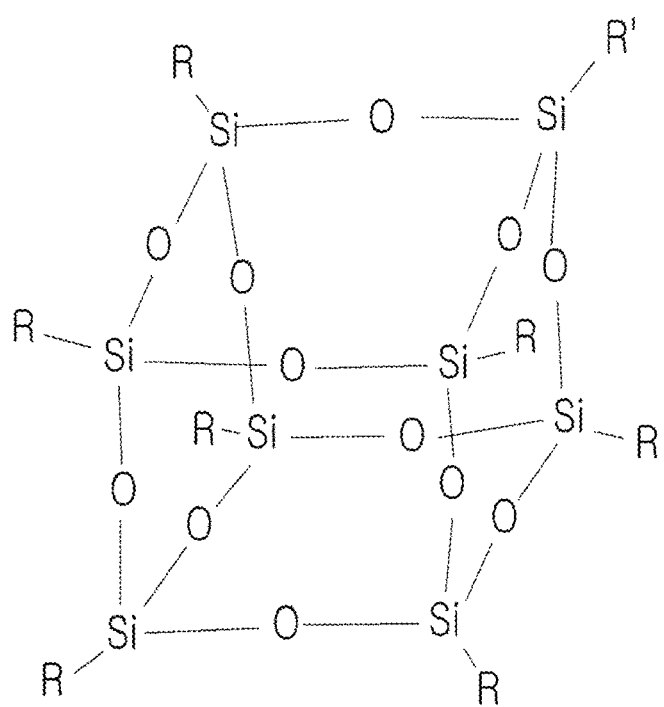

Referring to FIG. 2B, the POSS compound may have a heteroleptic structure having a formula $(RSiO_{1.5})_7(R'SiO_{1.5})_1$. The POSS compound includes eight silicon (Si) atoms. However, FIG. 2B is merely illustrative, and embodiments of the present invention are not limited to that structure. Although not shown, as described above, a functional group may be further bonded to at least one of Si atoms. Further, the POSS compound containing the eight Si atoms may have a homoleptic structure in which only one kind of organic substituent is bonded to the Si atoms.

Figure 2C:
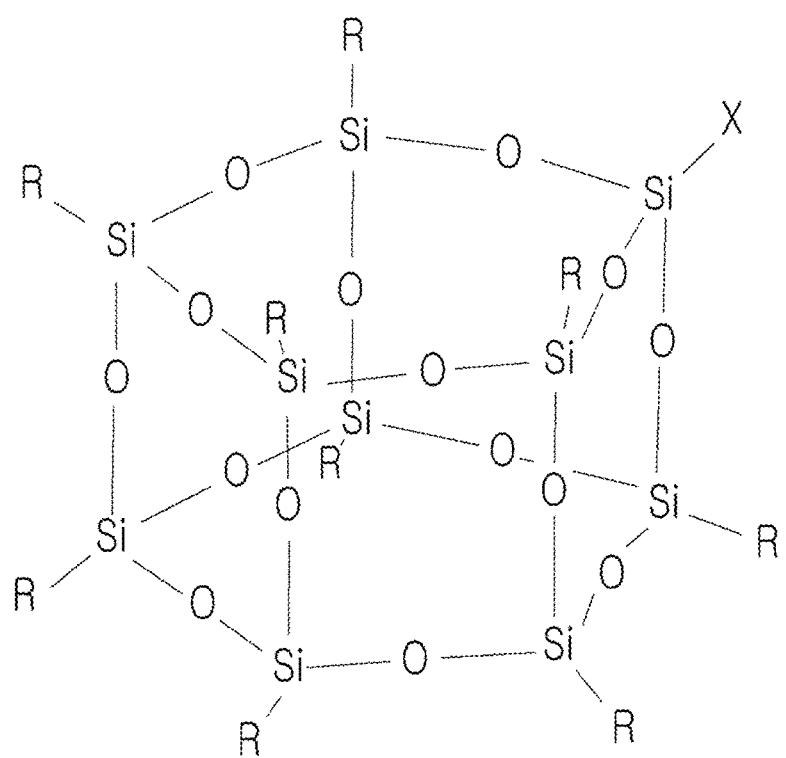

Referring to FIG. 2C, the POSS compound may include a nanoscale particle structure having a formula $(RSiO_{1.5})_9$ $(XSiO_{1.5})_1$ with ten silicon (Si) atoms. The embodiment illustrated in FIG. 2C is a nanoscale particle having a heteroleptic structure in which a functional group X is bonded to a Si atom. In other embodiments, two or more functional groups X may be bonded to Si atoms, or the POSS compound may have a homoleptic structure in which the functional groups X are bonded to all of the Si atoms. In still other embodiments, organic substituents may be bonded to all of the Si atoms in the POSS compound.

Figure 2D:
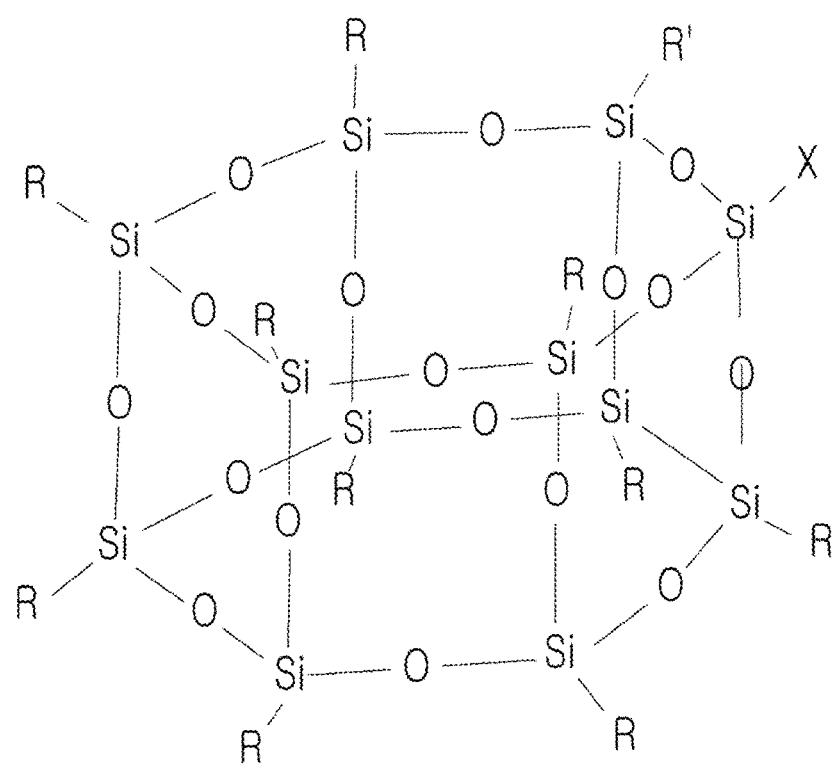

Referring to FIG. 2D, the POSS compound may include a nanoscale particle structure having a formula $(RSiO_{1.5})_{10}$ $(R'SiO_{1.5})_1(XSiO_{1.5})_1$ containing twelve silicon (Si) atoms. The compound of FIG. 2D is a compound in which three different kinds of ligands are bonded to Si atoms, but embodiments of the present invention are not limited thereto. For example, in an embodiment, the compound may have a homoleptic structure containing a single kind of organic substituent or single kind of functional group.

The compounds in the above-described embodiments may have a length of about 1.64±0.03 Å between silicon (Si) and oxygen (O), include a repetitive bond having a σ-bond structure, and have a structure of a rigid cage through the repetitive bond. The POSS compound may have a particle structure as a unimolecule itself, and thus a nanoscale particle structure may be provided using the POSS compound. The above-described POSS compound is similar to a siloxane compound in that the POSS compound includes a repetitive —O—Si—O— bond, but may be granulized in a nanoscale as a molecule itself. Therefore, the POSS compound may be discriminated from other siloxane compounds, including cyclic siloxanes such as hexamethylcyclotrisiloxane or decamethylcyclopentasiloxane, and linear siloxanes such as hexamethyldisiloxane or decamethyltetrasiloxane.

The POSS compound may be polymerized through polymerization between unimolecules, but the polymerization may cause the polishing characteristic to be degraded as described later. Therefore, the polymerization may be prevented or reduced by limiting a concentration of the POSS compound in the polishing slurry. As the number of Si atoms in the POSS compound is increased, the cage structure is weakened and the POSS compound is liable to be destructed or polymerized during a polishing process. Therefore, in embodiments, the number of Si atoms in a unimolecule POSS compound may be less than or equal to 12 to ensure a rigid nanoscale particle structure.

Figure 3:
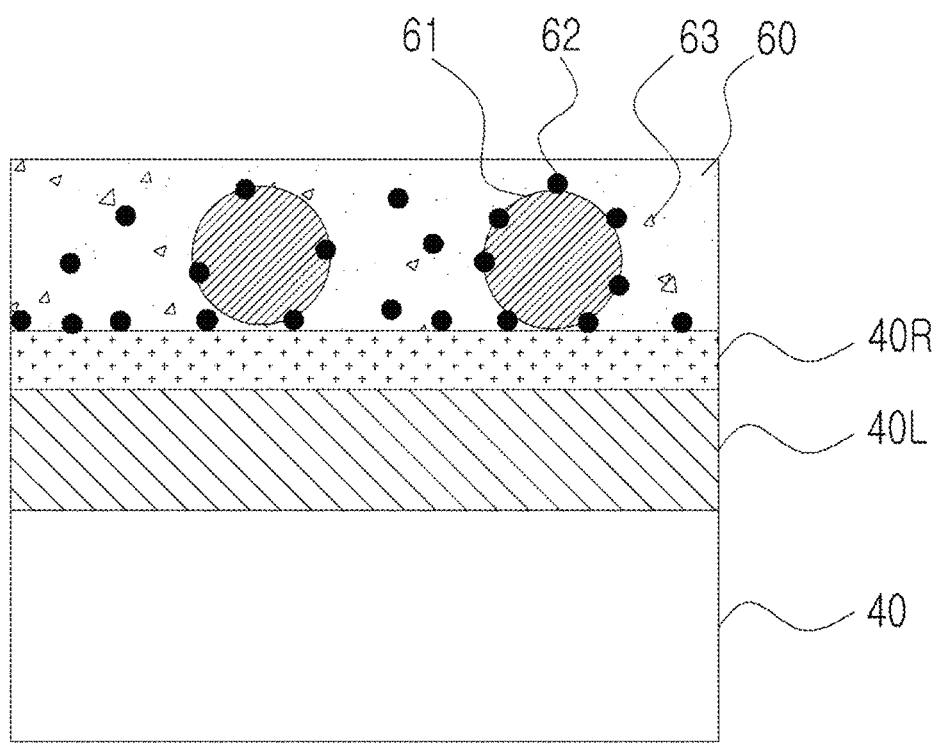
FIG. 3 is a schematic diagram schematically explaining a polishing mechanism of a thin film using a POSS compound according to an embodiment of the present invention.

FIG. 3 is a schematic diagram showing a polishing mechanism of the thin film 40L using a POSS compound according to an embodiment of the present invention.

Referring to FIG. 3, a polishing slurry 60 as described with reference to FIG. 1 includes polishing particles 61 and nanoscale particles 62. As described above, deionized water, or additive 63, such as an oxidizing agent, a surfactant, or a pH regulator may be further added to the polishing slurry 60.

While a thin film 40L, which is a layer to be polished on a substrate 40, is polished, metal or metalloid elements of the thin film 40L may be oxidized by the oxidizing agent in the polishing slurry 60, for example, hydrogen peroxide. Thus, a surface of the thin film 40L is consistently exposed to the oxidizing agent during the polishing process. Therefore, an oxide layer 40R may be consistently formed. The polishing particles 61 and the nanoscale particles 62 may mechanically polish the oxide layer 40R as an aspect of the polishing of the thin film 40L.

In a thin film 40L containing two or more different kinds of metal or metalloid elements, since different metal or metalloid elements have different oxidation rates from one another, it is difficult to obtain a uniform polishing mechanism by forming and removing the oxide layer 40R in balance between two or more different kinds of metal or metalloid elements. Thus, polishing speed may be reduced, surface roughness of the polished thin film may be increased, or the composition of a surface of the thin film may be different from the composition inside the thin film. When an electrode material layer is formed in a subsequent process, the polishing non-uniformity may cause an interfacial defect between the thin film and the electrode resulting in an adverse effect on device performance. In addition, the polishing non-uniformity may degrade an electrical characteristic of the thin film itself, and thus the polishing non-uniformity may be an obstacle to obtain reliable devices.

In an embodiment, non-uniformity due to variation in oxidation rates of different metal or metalloid elements in the thin film 40L can be reduced by the nanoscale particles 62. The nanoscale particles 62 have a rigid cage structure, but have lower hardness and smaller than the polishing particles 61, so the nanoscale particles 62 may cause finer mechanical damage to the surface of the thin film 40L. Therefore, a reaction surface of the thin film 40L may effectively increase, deviation in the oxidation rate between the different metal or metalloid elements can be alleviated, and polishing speed can be improved.

Furthermore, as shown in FIG. 3, nanoscale particles 62 are present between the polishing particles 61 and the oxide layer 40R during the polishing process, so that the nanoscale particles 62 can alleviate the mechanical damage that would otherwise result from direct contact of the polishing particles 61, and can be directly involved in the mechanical polishing to provide an even surface profile to a polished thin film 40L containing two or more different kinds of metal or metalloid elements.

In a semiconductor forming process, an interconnection structure such as a word line or a bit line and a selection device such as a diode or a transistor may be formed in the substrate 40. The thin film 40L may be used as a component of memory cells electrically connected to these circuit elements. In some embodiments, the thin film 40L may be buried in a plurality of holes formed in an interlayer insulating layer, and be arranged in an array structure in which the thin film 40L is electrically connected to the circuit elements.

For example, PcRAM devices may have a mushroom shaped structure in which a portion of the thin film 40L is buried in holes, and another portion extends onto an upper surface of an interlayer insulating layer or a pillar structure. The chemical mechanical polishing process according to the embodiment of the present invention may be performed as an etch-back process or a planarization process for finely patterning the thin films to have the above-described various structures.

The thin film 40L may include a chalcogenide material. For example, in an embodiment, the thin film 40L is a germanium (Ge)-antimony (Sb)-tellurium (Te) alloy. Tellurium (Te) is difficult to oxidize compared to germanium (Ge) and antimony (Sb). Therefore, since tellurium (Te) is harder to etch with a chemical mechanical polishing process than germanium (Ge) and/or antimony (Sb), a conventional polishing process may not uniformly remove the different metal or metalloid materials. However, when polishing such a material with a slurry according to an embodiment of the present invention, non-uniformity of the polishing process can be reduced or eliminated.

The Ge—Sb—Te alloy for the thin film is merely illustrative. Embodiments of the present invention provide similar advantages when processing other chalcogenide materials or chalcogenide glass materials such as GeSe, GeTeAs, GeSnTe, SeSnTe, GaSeTe, GeTeSnAu, SeSb$_2$, InSe, GeTe, BiSeSb, PdTeGeSn, InSeTiCo, InSbTe, In$_3$SbTe$_2$, GeTeSb$_2$, GeTe$_3$Sb, GeSbTePd, AgInSbTe and CuSe. Other materials that may be advantageously processed by embodiments of the present invention include a Perovskite-based metal oxide thin film such as PbZr$_x$Ti$_{1-x}$O$_3$ or a magnetic thin film such as NiFe and CoZr for variable resistive thin films, which contain two or more different kinds of metal or metalloid elements.

Persons of skill in the art will recognize that embodiments of the present invention provide advantages for a CMP process conducted on materials, including alloys, compounds, and composites, having at least two different metal or metalloid elements. In addition, embodiments of the present invention may be beneficial in a CMP process that removes separate or continuous structures made of different materials where it is desirable to remove the different materials at a relatively uniform rate. Certain materials, such as Germanium (Ge), Antimony (Sb), Tellurium (Te), and silicon (Si) are generally referred to as "metalloid" elements, due to properties that fall somewhere between a metal and a non-metal. As used herein, the term "metalloid" includes the aforementioned elements, as well as Boron (B), Polonium (Po), Selenium (Se), and Arsenic (As).

Hereinafter, the present invention will be described in more detail through specific embodiments. The following disclosure is for the purpose of describing embodiments only and is not intended to limit the present invention.

Embodiment 1

Figure 4A:
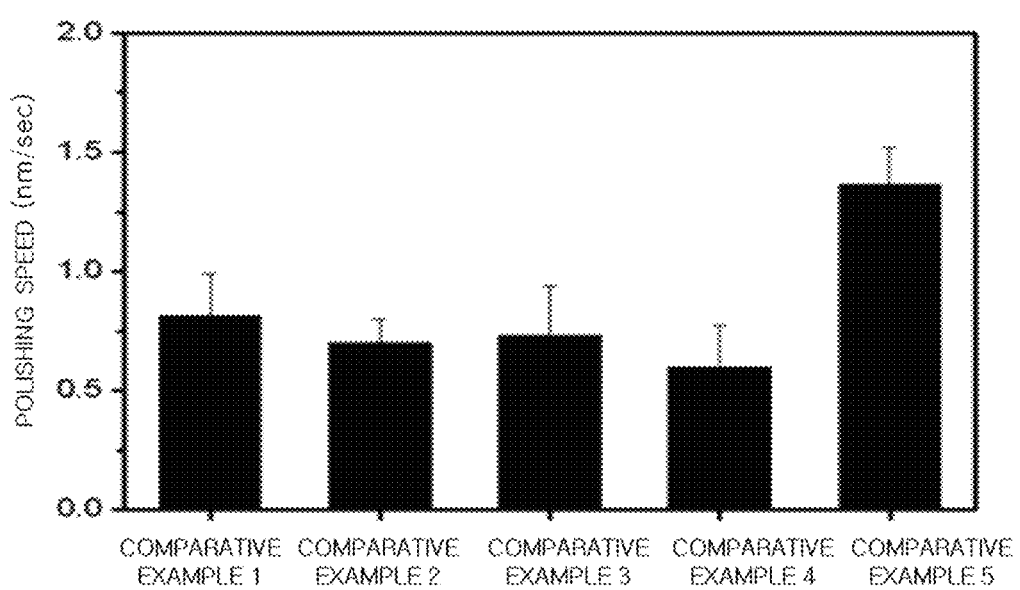
FIG. 4A is a graph showing polishing speeds.
Figure 4B:
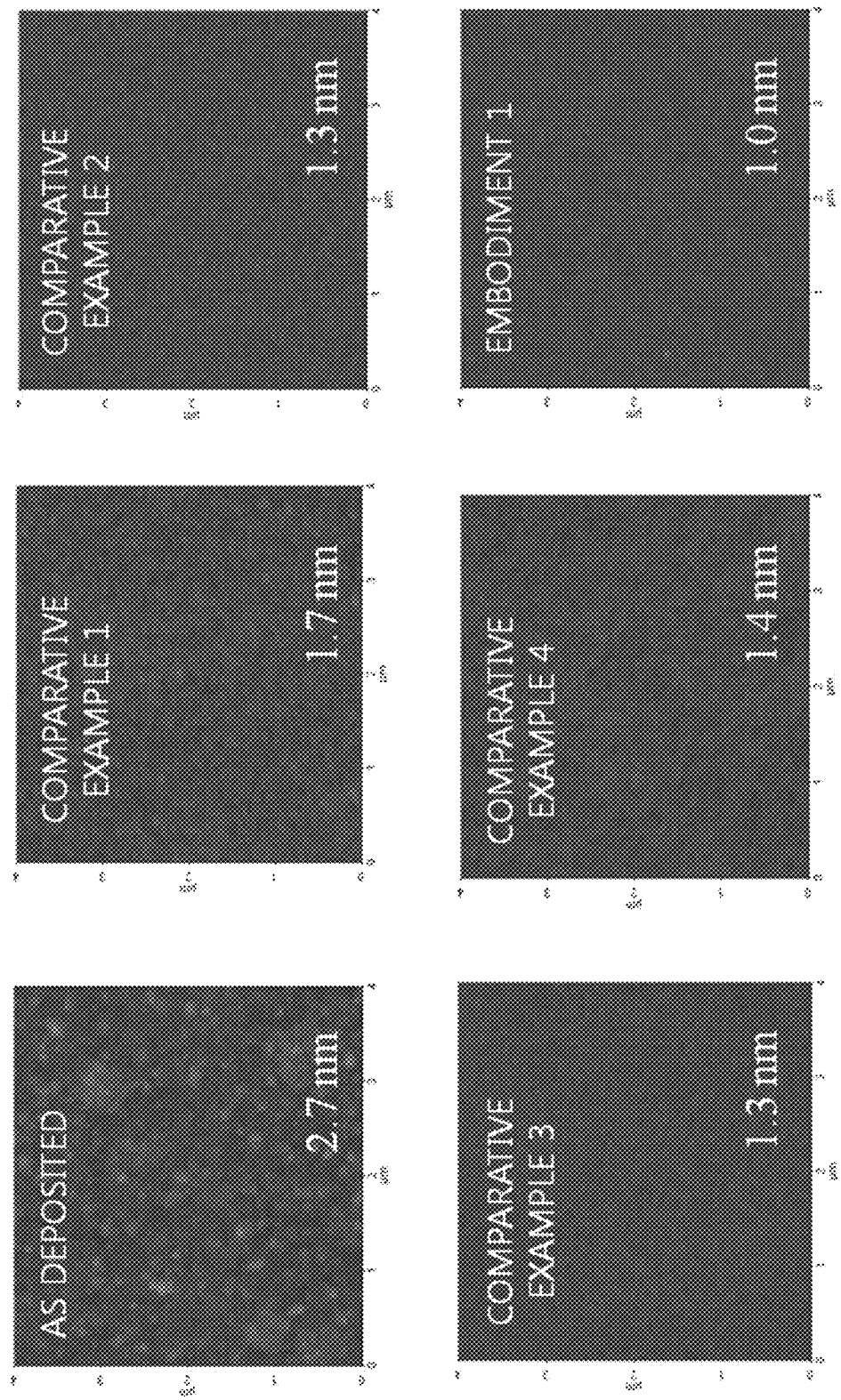
FIG. 4B shows atomic force microscopic (AFM) images of surfaces processed by Embodiment 1 and Comparative Examples 1 to 4.

The polishing slurry of Embodiment 1 was fabricated. The polishing slurry of Embodiment 1 includes fumed silica particles having a size of about 20 nm as polishing particles which were mixed to have a concentration of 1 wt % of the total weight of the polishing slurry. A POSS compound having eight Si atoms was used as a nanoscale particle component at a concentration of about 1 wt % of the total weight of the polishing slurry. In addition, hydrogen peroxide was used as an oxidizing agent at a concentration of about 1 wt % of the total weight of the polishing slurry. The remaining components of the polishing slurry include deionized water. Hereinafter, the polishing slurry may be referred to as Embodiment 1. The film that was polished to gather data illustrated in FIGS. 4A and 4B is a chalcogenide thin film having slurry of Ge1Sb6Te3 deposited through an atomic layer deposition (ALD) method. However, embodiments of the present invention can be used to advantageously process chalcogenide thin film that is formed through a chemical vapor deposition (CVD), a sputtering, laser ablation, or other similar methods.

The chemical mechanical planarization apparatus used to gather the data of FIG. 4 has essentially the same configuration as the apparatus 100 illustrated in FIG. 1, with a polytex polishing pad. The speed of the platen and the substrate holder were fixed to about 50 RPM and about 90 RPM, respectively. Down-pressure was maintained at about 0.05 kg/cm2, and a polishing time period was about 20 seconds.

To compare the polishing characteristics of Embodiment 1, four comparative examples were performed; Comparative Example 1 of a polishing slurry with no nanoscale particles 62; Comparative Example 2 of a polishing slurry in which polyacrylic acid 5000 (PAA 5000), which is a polymer, is added at a concentration of about 1 wt % of the total weight of the polishing slurry instead of the nanoscale particles 62; Comparative Example 3 of a polishing slurry in which polyacrylic acid 25000 (PAA 25000) is added at a concentration of about 1 wt % of the total weight of the polishing slurry; and Comparative Example 4 of a polishing slurry in which poly vinyl alcohol 1500 (PVA 1500), which is another polymer is added at a concentration of about 1 wt % of the total weight of the polishing slurry. In Comparative Examples 1-4, the hydrogen peroxide was used as an oxidizing agent at a concentration of about 1 wt % of the total weight of the polishing slurry and the remaining components of the polishing slurry include deionized water. Thus, none of the comparative examples included POSS nanoscale particles 62, but examples 2-4 included various polymeric components. All examples used the same size, type, and concentration of polishing particles as Embodiment 1, and conditions including the composition of the slurries were controlled to isolate the abrasive materials as experimental variables. In the Comparative Examples 1 through 4, other polishing process parameters are the same as in Embodiment 1.

FIGS. 4A and 4B show polishing characteristics of Embodiment 1 and Comparative Examples 1 through 4. FIG. 4A is a graph showing polishing speeds (rates) of Embodiment 1 and Comparative Examples 1 through 4, and FIG. 4B are atomic force microscopic (AFM) images of Embodiment 1 and Comparative Examples 1 through 4.

Referring to FIG. 4A, the polishing speeds of Embodiment 1 and Comparative Examples 1 through 4 are 0.82 nm/sec, 0.7 nm/sec, 0.73 nm/sec, and 0.60 nm/sec, respectively. However, the polishing speed of Embodiment 1 is 1.37 nm/sec. The polishing speed of Embodiment 1, which includes the POSS compound, is around twice that the speed of Comparative Examples 2 through 4 in which the polymers are added to the polishing slurries. Although the polishing speed of Comparative Example 1 using only polishing particles is greater than those of Comparative Examples 2 through 4, the surface profile of the polished Ge$_1$Sb$_6$Te$_3$ film in Comparative Example 1 is inferior to those in Comparative Examples 2 to 4, which will be described later with reference to FIG. 4B. Thus, the POSS compound provides clear advantages with respect to the surface profile and polishing speed.

Referring to FIG. 4B, it can be seen that the polishing processes reduces the surface roughness compared to the surface roughness, i.e., 2.7 nm of the Ge$_1$Sb$_6$Te$_3$ film as deposited. The magnitude of roughness values correspond to root mean square (RMS) value of deviation from average of low and high points of an individual uneven surface, so that lower values indicate a smoother surface. The surface roughness values in Comparative Examples 1 through 4 are 1.7 nm, 1.3 nm, 1.3 nm, and 1.4 nm, respectively. As the roughness of the polished surface of the film is reduced, a depth of focus (DOF) for a photolithography process can increase, and thus a high-resolution photolithography process may be implemented. The surface profile in Embodiment 1 has a value of 1.0 nm. The surface profile obtained in Embodiment 1 meets a performance applicable to devices having a design rule of 20 nm.

Embodiments 2-5

Embodiments 2 through 5 were used to perform a polishing process on a chalcogenide thin film having composition of Ge$_1$Sb$_6$Te$_3$ under the same polishing condition as that of Embodiment 1 while varying a concentration of the POSS compound added to the polishing slurry. The concentration of POSS compounds in the slurries of embodiments 2, 1, 3, 4, and 5 were 0.5 wt %, 1.0 wt %, 2.0 wt %, 2.5 wt %, and 5 wt % of a total polishing slurry of 100 wt %, respectively.

For comparison, polishing characteristics were evaluated for Comparative Example 1, which is a slurry in which the POSS compound is not added. In Embodiment 2, the concentration of the POSS compound is 0.5 wt %; in Embodiment 3, the concentration of the POSS compound is 2.0 wt %; in Embodiment 4, the concentration of the POSS compound is 2.5 wt %; and, in Embodiment 5, the concentration of the POSS compound is 5.0 wt %. Embodiment 1, in which the concentration of the POSS compound is 1.0 wt %, is the same slurry used in the experiments discussed above with respect to FIG. 4. Other materials in the slurries used to create the data shown in FIGS. 5A and 5B were controlled to isolate the abrasive materials as the variable.

Figure 5A:
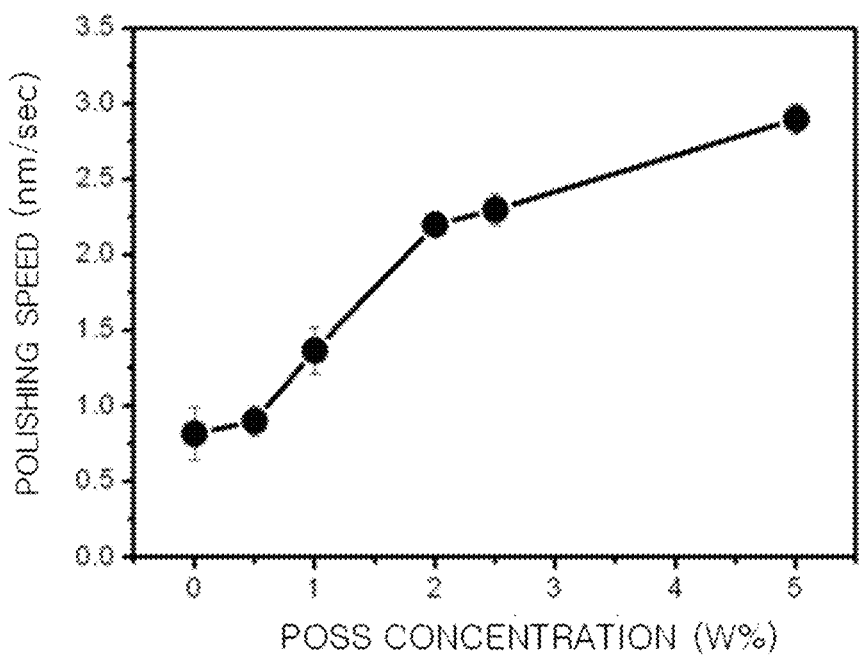
Figure 5B:
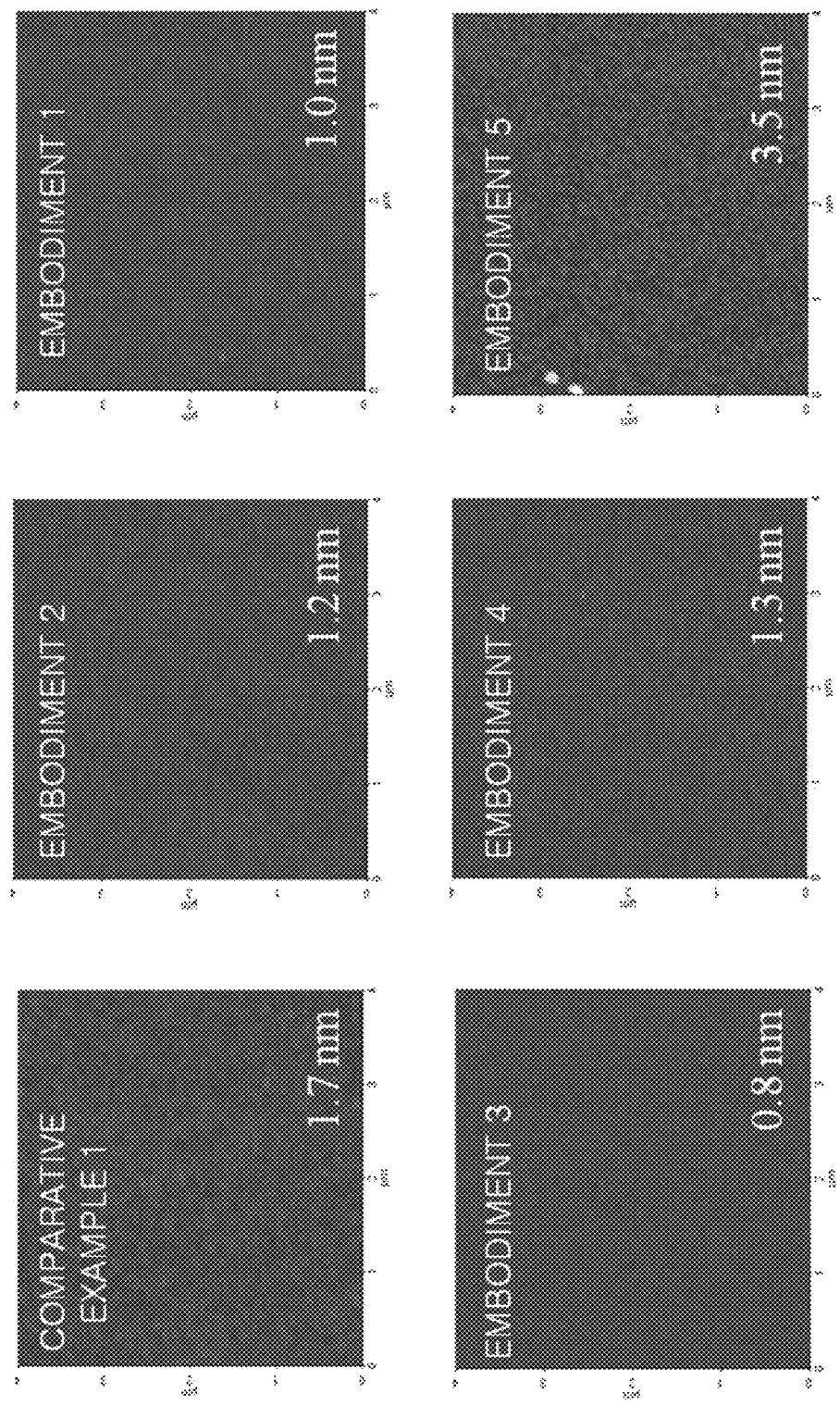
FIG. 5B shows AFM images of surfaces processed by Embodiments 1 to 5 and Comparative Example 1.

FIGS. 5A and 5B show polishing characteristics of Embodiments 1 to 5 and Comparative Example 1. FIG. 5A is a graph showing polishing speeds of Embodiments 1 through 5 and Comparative Example 1, and FIG. 5B are AFM images of Embodiments 1 through 5 and Comparative Example 1.

Referring to FIG. 5A, as the concentration of the POSS material in the polishing slurry is increased, the polishing speed is gradually increased to 0.9 nm/sec (in Embodiment 2), 1.37 nm/sec (in Embodiment 1), 2.20 nm/sec (in Embodiment 3), 2.30 nm/sec (in Embodiment 4), and 2.90 nm/sec (in Embodiment 5), respectively, as compared to the polishing speed of 0.82 nm/sec in Comparative Example 1.

As the concentration of the POSS compound is increased, the polishing speed is advantageously increased, but the surface profile of the polished thin film may be degraded after the polishing is completed. As seen in Embodiment 5, when the concentration of the POSS compound is 5.0 wt %, the surface roughness is abruptly increased to 3.5 nm. This is to be expected because polymerization between the POSS compounds increases with as the concentration of the added POSS compound increases. In other words, the nanoscale particle characteristics are lost by the polymerization of the POSS compound. In an embodiment, it is preferable to suppress the polymerization of the POSS compound by limiting the number of the Si atoms of the POSS compound equal to or lower than twelve.

In some embodiments, the concentration of the POSS compound may be in a range of about 0.1 wt % through about 3 wt %, including 0.5 wt %, 1.0 wt %, 2.0 wt % and 2.5 wt %, of the polishing slurry of 100 wt %. Preferably, the concentration of the POSS compound may be in a range of about 0.5 wt % to about 2.5 wt % of the polishing slurry of 100 wt %.

According to embodiments of the present invention, a polishing slurry capable of reducing deviation in polishing characteristics, which may be due to different oxidation rates of different metal or metalloid elements in a thin film containing two or more metal or metalloid elements, may be provided by adding polishing particles and nanoscale particles having polyhedral structure having a smaller size than the polishing particles to the polishing compound.

According to the other embodiments of the present invention, a method of chemical mechanical planarization for a thin film containing two or more metal or metalloid elements, which can alleviate deviation between oxidation rates of different metal or metalloid elements when polishing and improve the polishing speed and simultaneously ensure a good surface profile, may be provided.

The features of various polishing slurries disclosed with reference to the accompanying drawings herein may be substituted from each other and combined with each other. While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A polishing slurry for planarizing a thin film containing a chalcogenide material or a chalcogenide glass material, the polishing slurry comprising:
   polishing particles; and
   nanoscale particles of a polyhedral oligomeric silsesquioxane (POSS) having a smaller size than the polishing particles, each of the nanoscale particles including at least one silicon (Si) atom bonded to an oxygen (O) atom,
   wherein the POSS compound includes a compound having a formula $(RSiO_{1.5})_m(R'SiO1.5)_n(XSiO_{1.5})_l$,
   wherein R and R' are organic substituents, X is a functional group, each of m, n, and l is an integer equal to or greater than 0 (zero), and
   wherein a value of m+n+l is in a range from 6 to 12 so that the nanoscale particles are rigid and not polymerized during polishing of the thin film.

2. The polishing slurry of claim 1, wherein the polishing particles includes alumina ($AlO_x$), ceria ($CeO_x$), zirconia ($ZrO_x$), titania ($TiO_x$), germania ($GeO_x$), chromium oxide ($CrO_x$), manganese oxide ($MnO_x$), silica ($SiO_x$) or a combination thereof.

3. The polishing slurry of claim 1, wherein the polishing particles have an average size of about 10 nm to about 150 nm.

4. The polishing slurry of claim 1, wherein the polishing particles have an average size of about 10 nm to about 100 nm.

5. The polishing slurry of claim 1, wherein the organic substituents includes hydrogen, an acid, an alcohol-based functional group, a carboxyl-based functional group, an ester-based functional group, an ether-based functional group, an amine-based functional group, a thiol-based functional group, a ketone-based functional group, a phosphate-based functional group, an olefin-based functional group or a combination thereof.

6. The polishing slurry of claim 1, wherein the functional group includes a hydroxyl group, a halogen group, an alkoxide group, an acetate group, a peroxide group, an amine group, an isocyanate group, or a combination thereof.

7. The polishing composition of claim 1, further comprising deionized water, an oxidizing agent, a surfactant, a pH regulator, or a combination thereof.

8. The polishing slurry of claim 1, wherein the thin film further includes tellurium (Te).

9. A method of chemical mechanical planarization comprising:
   providing a substrate having a surface on which a thin film including a chalcogenide material or a chalcogenide glass material is exposed so that the surface of the substrate comes in contact with a polishing pad;
   providing a polishing slurry between the polishing pad and the surface of the substrate, the polishing slurry including polishing particles and nanoscale particles of a polyhedral oligomeric silsesquioxane (POSS), the nanoscale particles having a smaller size than the polishing particles; and
   polishing the thin film with the polishing slurry,
   wherein the POSS compound includes a compound having a formula $(RSiO_{1.5})_m(R'SiO_{1.5})_l$,
   wherein R and R' are organic substituents, X is a functional group, each of m, n, and l is an integer equal to or greater than 0 (zero), and
   wherein a value of m+n+l is in a range from 6 to 12 so that the nanoscale particles are rigid and not polymerized during polishing of the thin film.

10. The method of claim 9, wherein the polishing particles includes any one selected from the group consisting of alumina ($AlO_x$), ceria ($CeO_x$), zirconia ($ZrO_x$), titania ($TiO_x$), germania ($GeO_x$), chromium oxide ($CrO_x$), manganese oxide ($MnO_x$), and silica ($SiO_x$) or a combination thereof.

11. The method of claim 9, wherein the polishing particles have an average size of about 10 nm to about 150 nm.

12. The method of claim 9, wherein the polishing particles have an average size of about 10 nm to about 100 nm.

13. The method of claim 9, wherein the organic substituents include hydrogen, an acid, an alcohol-based functional group, a carboxyl-based functional group, an ester-based functional group, an ether-based functional group, an amine-based functional group, a thiol-based functional group, a ketone-based functional group, a phosphate-based functional group, an olefin-based functional group or a combination thereof.

14. The method of claim 9, wherein the functional group includes a hydroxyl group, a halogen group, an alkoxide group, an acetate group, a peroxide group, an amine group, an isocyanate group, or a combination thereof.

15. The method of claim 9, wherein the polishing slurry further includes deionized water, an oxidizing agent, a surfactant, a pH regulator or a combination thereof.

16. The method of claim 9, wherein the thin film includes tellurium (Te).

17. A polishing slurry for planarizing a thin film containing a chalcogenide material or a chalcogenide glass material, the polishing slurry comprising:
nanoscale polyhedral oligomeric silsesquioxane (POSS) particles; and
polishing particles that are at least about seven times larger than the nanoscale POSS particles,
wherein the POSS compound includes a compound having a formula $(RSiO_{1.5})_m(R'SiO_{1.5})_n(XSiO_{1.5})_l$,
wherein R and R' are organic substituents, X is a functional group, each of m, n, and l is an integer equal to or greater than 0 (zero), and
wherein a value of m+n+l is from 6 to 12.

18. The polishing slurry of claim 17, wherein the polishing particles have a diameter from 10 nm to 20 nm.

19. The polishing slurry of claim 17, wherein the polishing particles include silica ($SiO_x$).

* * * * *